(12) United States Patent
Grivna et al.

(10) Patent No.: US 10,340,160 B2
(45) Date of Patent: Jul. 2, 2019

(54) METHOD OF FORMING A SEMICONDUCTOR DIE CUTTING TOOL

(71) Applicant: SEMICONDUCTOR COMPONENTS INDUSTRIES, LLC, Phoenix, AZ (US)

(72) Inventors: Gordon M. Grivna, Mesa, AZ (US); John M. Parsey, Jr., Phoenix, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 20 days.

(21) Appl. No.: 14/885,804

(22) Filed: Oct. 16, 2015

(65) Prior Publication Data

US 2016/0035599 A1    Feb. 4, 2016

Related U.S. Application Data

(60) Division of application No. 14/484,843, filed on Sep. 12, 2014, now Pat. No. 9,196,511, which is a division of application No. 13/486,675, filed on Jun. 1, 2012, now Pat. No. 9,012,304, which is a continuation-in-part of application No. 12/749,370, filed on Mar. 29, 2010, now Pat. No. 7,985,661, which is a continuation of application No.

(Continued)

(51) Int. Cl.
| | |
|---|---|
| *H01L 21/67* | (2006.01) |
| *H01L 21/78* | (2006.01) |
| *B28D 5/00* | (2006.01) |
| *B23P 15/28* | (2006.01) |

(52) U.S. Cl.
CPC ........ *H01L 21/67092* (2013.01); *B23P 15/28* (2013.01); *B28D 5/0005* (2013.01); *B28D 5/0011* (2013.01); *H01L 21/78* (2013.01); *Y10T 83/0333* (2015.04)

(58) Field of Classification Search
CPC . H01L 21/302; H01L 21/304; H01L 21/3043; H01L 21/3185; H01L 21/561; H01L 21/563; H01L 21/568; H01L 21/67132; H01L 21/681; H01L 21/6836; H01L 21/6835; H01L 21/76898; H01L 21/768; H01L 21/77; H01L 21/78
USPC ....... 438/113, 114, 460, 462, 700, 704, 706, 438/710, 745, FOR. 118, FOR. 386; 407/113, 114, 115, 116
See application file for complete search history.

(56) References Cited

U.S. PATENT DOCUMENTS

| | | | |
|---|---|---|---|
| 4,820,377 A | | 4/1989 | Davis et al. |
| 4,993,892 A | * | 2/1991 | Takahashi ............. B23B 27/065 407/114 |
| 5,851,928 A | | 12/1998 | Cripe et al. |

(Continued)

OTHER PUBLICATIONS

Merriam-Webster Dictionary, Defnition of Chip, pp. 1-17.*

(Continued)

*Primary Examiner* — Mamadou L Diallo
(74) *Attorney, Agent, or Firm* — Robert F. Hightower

(57) ABSTRACT

In one embodiment, a method of singulating semiconductor die from a semiconductor wafer includes forming a material on a surface of a semiconductor wafer and reducing a thickness of portions of the material. Preferably, the thickness of the material is reduced near where singulation openings are to be formed in the semiconductor wafer.

5 Claims, 15 Drawing Sheets

Related U.S. Application Data

11/834,924, filed on Aug. 7, 2007, now Pat. No. 7,781,310.

(56) References Cited

U.S. PATENT DOCUMENTS

| | | | |
|---|---|---|---|
| 5,856,705 A | 1/1999 | Ting | |
| 5,863,813 A | 1/1999 | Dando | |
| 6,140,151 A | 10/2000 | Akram | |
| 6,165,814 A | 12/2000 | Wark et al. | |
| 6,200,851 B1 | 3/2001 | Arnold | |
| 6,214,703 B1 | 4/2001 | Chen et al. | |
| 6,342,724 B1 | 1/2002 | Wark et al. | |
| 6,406,797 B1 | 6/2002 | Fischer et al. | |
| 6,528,864 B1 | 3/2003 | Arai | |
| 6,563,204 B1 | 5/2003 | Glenn | |
| 6,642,127 B2 | 11/2003 | Kumar et al. | |
| 6,686,225 B2 | 2/2004 | Wachtler | |
| 7,060,531 B2 | 6/2006 | Arita | |
| 7,064,101 B2 | 6/2006 | Tanaka et al. | |
| 7,129,114 B2 | 10/2006 | Akram | |
| 7,335,576 B2 | 2/2008 | David et al. | |
| 7,488,668 B2 | 2/2009 | Arita et al. | |
| 7,781,310 B2 | 8/2010 | Grivna | |
| 7,985,661 B2 | 7/2011 | Grivna | |
| 7,989,319 B2 | 8/2011 | Grivna et al. | |
| 8,012,857 B2 | 9/2011 | Grivna et al. | |
| 2003/0207579 A1 | 11/2003 | Rattner et al. | |
| 2005/0072766 A1 | 4/2005 | Arita | |
| 2005/0084996 A1 | 4/2005 | Harper | |
| 2005/0104165 A1 | 5/2005 | Ishio et al. | |
| 2006/0030078 A1 | 2/2006 | Jiang et al. | |
| 2006/0068567 A1 | 3/2006 | Beyne et al. | |
| 2007/0087524 A1 | 4/2007 | Montgomery | |
| 2007/0132034 A1 | 6/2007 | Curello et al. | |
| 2007/0148807 A1 | 6/2007 | Akram | |
| 2007/0249178 A1 | 10/2007 | Ogihara | |
| 2007/0264832 A1 | 11/2007 | Arita et al. | |
| 2008/0113461 A1 | 5/2008 | Tung et al. | |
| 2008/0213977 A1 | 9/2008 | Wyant | |
| 2008/0274603 A1 | 11/2008 | Do et al. | |
| 2009/0001609 A1 | 1/2009 | Lim | |
| 2009/0042366 A1 | 2/2009 | Grivna | |
| 2009/0209087 A1 | 8/2009 | Arita | |
| 2010/0055875 A1 | 3/2010 | Haji et al. | |
| 2010/0124246 A1 | 5/2010 | Lutgen et al. | |
| 2010/0197115 A1 | 8/2010 | Arita et al. | |

OTHER PUBLICATIONS

Office Action dated Mar. 13, 2015 for counterpart Taiwanese Patent Application No. 099140643, 4 pages.

Second Office Action dated Aug. 2, 2018, for counterpart Chinese Patent Application No. 201410095338.X, 9 pages.

* cited by examiner

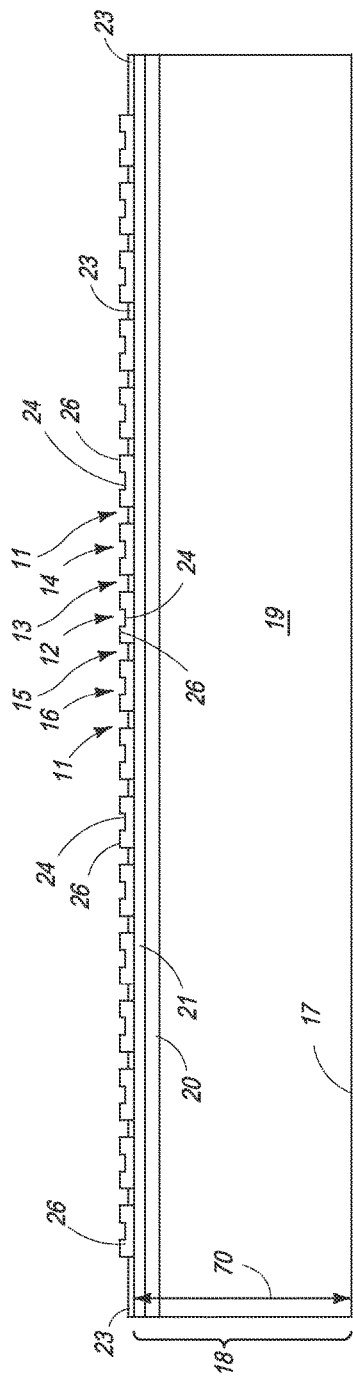
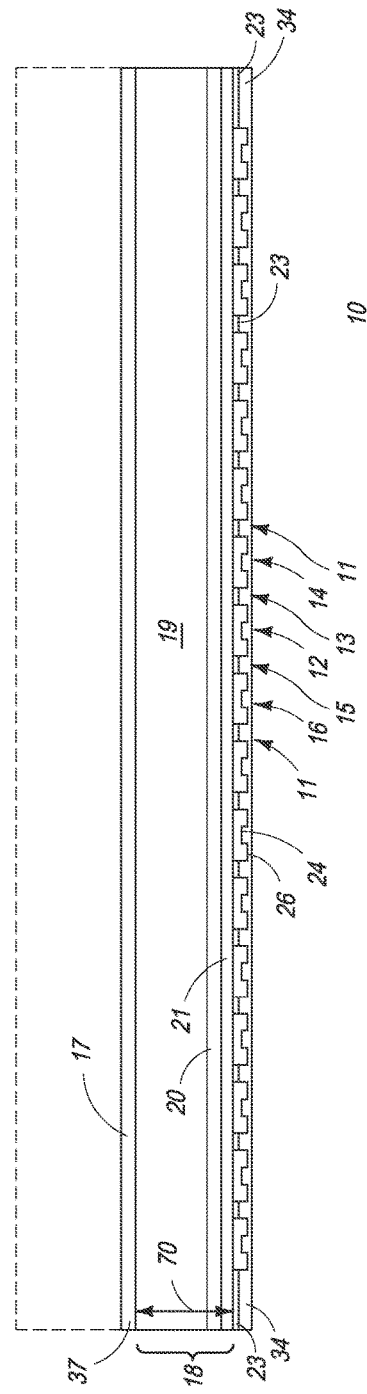

METHOD OF FORMING A SEMICONDUCTOR DIE CUTTING TOOL

The present application is a divisional of prior U.S. application Ser. No. 14/484,843, filed on Sep. 12, 2014, which is a divisional of prior U.S. application Ser. No. 13/486,675, filed on Jun. 1, 2012, which is a continuation of prior application Ser. No. 13/156,636 now U.S. Pat. No. 8,859,636 which is a continuation-in-part application of prior U.S. application Ser. No. 12/749,370, filed on Mar. 29, 2010, now U.S. Pat. No. 7,985,661 which is a continuation of prior U.S. application Ser. No. 11/834,924, filed on Aug. 7, 2007, now U.S. Pat. No. 7,781,310, all of which have at least one common inventor, a common assignee, and are hereby incorporated herein by reference and priority thereto for common subject matter is hereby claimed.

BACKGROUND

The present invention relates, in general, to electronics, and more particularly, to methods of forming semiconductors.

In the past, the semiconductor industry utilized various methods and equipment to singulate individual semiconductor die from a semiconductor wafer on which the die was manufactured. Typically, a technique called scribing or dicing was used to either partially or fully cut through the wafer with a diamond cutting wheel along scribe grids that were formed on the wafer between the individual die. To allow for the alignment and the width of the dicing wheel each scribe grid usually had a large width, generally about one hundred fifty (150) microns, which consumed a large portion of the semiconductor wafer. Additionally, the time required to scribe all of the scribe grids on the entire semiconductor wafer could take over one hour. This time reduced the throughput and manufacturing capacity of a manufacturing area.

Another method of singulating individual semiconductor die used lasers to cut through the wafers along the scribe grids. However, laser scribing was difficult to control and also resulted in non-uniform separation. Laser scribing also required expensive laser equipment as well as protective equipment for the operators.

Accordingly, it is desirable to have a method of singulating die from a semiconductor wafer that increases the number of semiconductor die on the wafer, that provides more uniform singulation, that reduces the time to perform the singulation, and that has a narrower scribe line.

BRIEF DESCRIPTION OF THE DRAWINGS

FIG. 8 illustrates a cross-sectional view of another embodiment of another portion of the semiconductor wafer of FIG. 1 at a stage in an alternate process of singulating die from the wafer in accordance with the present invention;

FIG. 9-FIG. 11 illustrate the semiconductor wafer of FIG. 1 at subsequent stages in the alternate process of singulating the die from the wafer of FIG. 1 in accordance with the present invention;

For simplicity and clarity of the illustration, elements in the figures are not necessarily to scale, and the same reference numbers in different figures denote the same elements. Additionally, descriptions and details of well-known steps and elements are omitted for simplicity of the description. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles. The terms first, second, third and the like in the claims or/and in the Detailed Description of the Drawings, as used in a portion of a name of an element are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein. The use of the word approximately or substantially means that a value of an element has a parameter that is expected to be close to a stated value or position.

However, as is well known in the art there are always minor variances that prevent the values or positions from being exactly as stated. It is well established in the art that variances of up to at least ten per cent (10%) (and up to twenty per cent (20%) for semiconductor doping concentrations) are reasonable variances from the ideal goal of exactly as described.

DETAILED DESCRIPTION OF THE DRAWINGS

Figure 1:
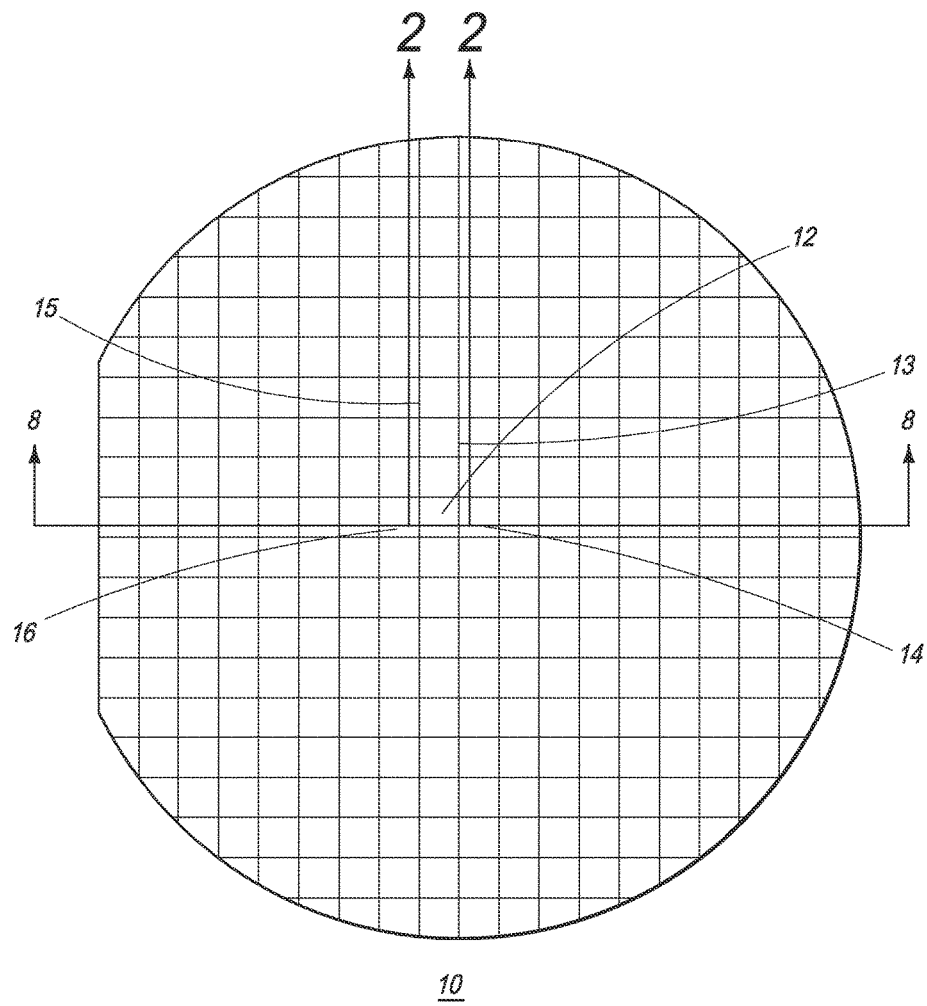
FIG. 1 illustrates a reduced plan view of an embodiment of a semiconductor wafer in accordance with the present invention.

FIG. 1 is a reduced plan view graphically illustrating, in a general manner, an example of an embodiment of a semiconductor wafer 10 that has a plurality of semiconductor die, such as die 12, 14, and 16, formed on semiconductor wafer 10. Die 12, 14, and 16 are spaced apart from each other on wafer 10 by spaces in which singulation lines are to be formed, such as singulation lines 13 and 15. As is well known in the art, all of the plurality of semiconductor die generally are separated from each other on all sides by areas where singulation lines such as lines 13 and 15 are to be formed.

Figure 2:
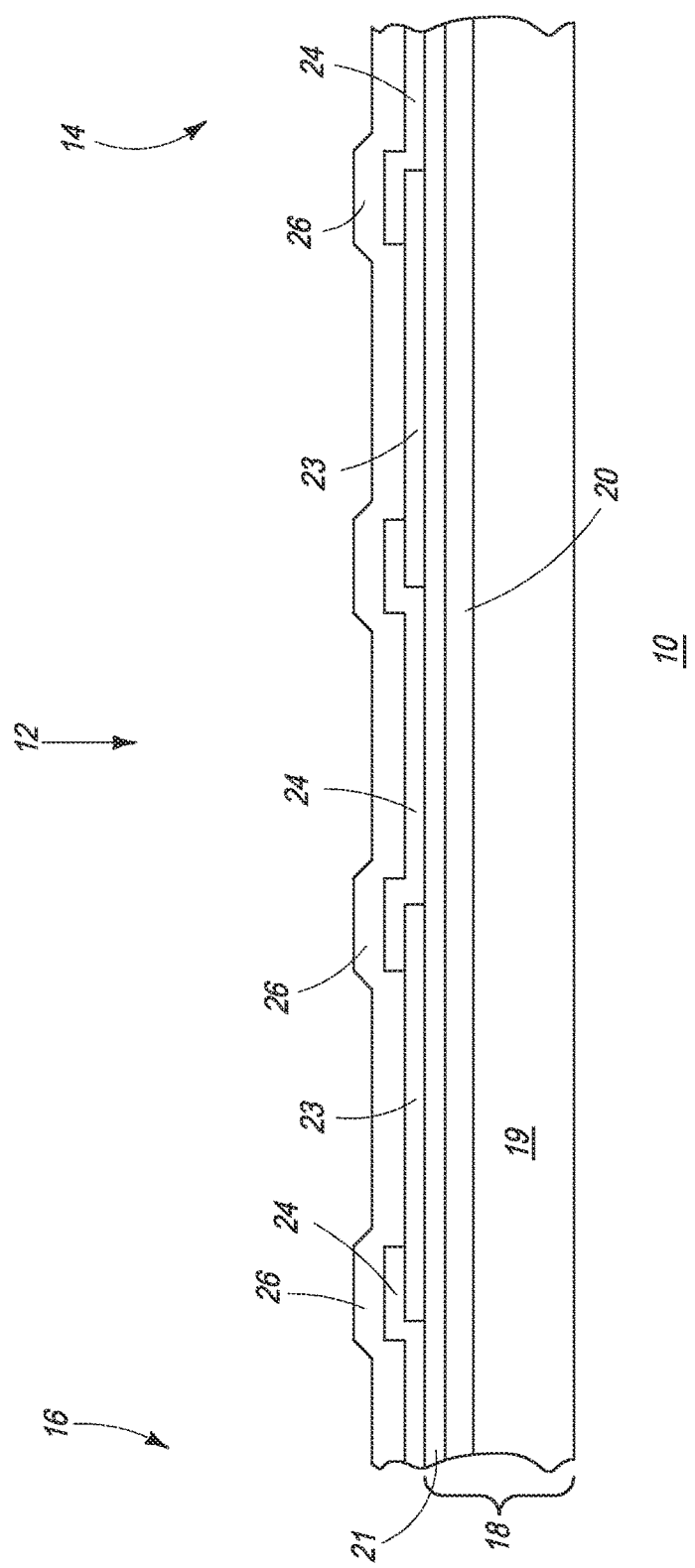
FIG. 2 illustrates a cross-sectional view of an embodiment of a portion of the semiconductor wafer of FIG. 1 at a stage in a process of singulating die from the wafer in accordance with the present invention.

FIG. 2 illustrates an enlarged cross-sectional portion of wafer 10 of FIG. 1 taken along section line 2-2. For clarity of the drawings and of the description, this section line 2-2 is illustrated to cross-section only die 12 and portions of dice 14 and 16. Die 12, 14, and 16 may be any type of semiconductor die including a vertical transistor, a lateral transistor, or an integrated circuit that includes a variety of types of semiconductor devices. Semiconductor dice 12, 14, and 16 generally include a semiconductor substrate 18 that may have doped regions formed within substrate 18 in order to form active and passive portions of the semiconductor die. The cross-sectional portion illustrated in FIG. 2 is taken along a contact pad 24 of each of dice 12, 14, and 16. Contact pad 24 generally is a metal that is formed on the semiconductor die in order to provide electrical contact between the semiconductor die and elements external to the semiconductor die. For example, contact pad 24 may be formed to receive a bonding wire that may subsequently be attached to pad 24 or may be formed to receive a solder ball or other type of interconnect structure that may subsequently be attached to pad 24. Substrate 18 includes a bulk substrate 19 that has an epitaxial layer 20 formed on a surface of bulk substrate 19. A portion of epitaxial layer 20 may be doped to form a doped region 21 that is used for forming active and passive portions of semiconductor die 12, 14, or 16. Layer 20 and/or region 21 may be omitted in some embodiments or may be in other regions of dice 12, 14, or 16. Typically, a dielectric 23 is formed on a top surface of substrate 18 in order to isolate pad 24 from other portions of the individual semiconductor die and to isolate each pad 24 from the adjacent semiconductor die. Dielectric 23 usually is a thin layer of silicon dioxide that is formed on the surface of substrate 18. Contact pad 24 generally is a metal with a portion of contact pad 24 electrically contacting substrate 18 and another portion formed on a portion of dielectric 23. After dice 12, 14, and 16 are formed including the metal contacts and any associated inter-layer dielectrics (not shown), a dielectric 26 is formed over all of the plurality of semiconductor die to function as a passivation layer for wafer 10 and for each individual semiconductor die 12, 14, and 16. Dielectric 26 usually is formed on the entire surface of wafer 10 such as by a blanket dielectric deposition. The thickness of dielectric 26 generally is greater than the thickness of dielectric 23.

Figure 3:
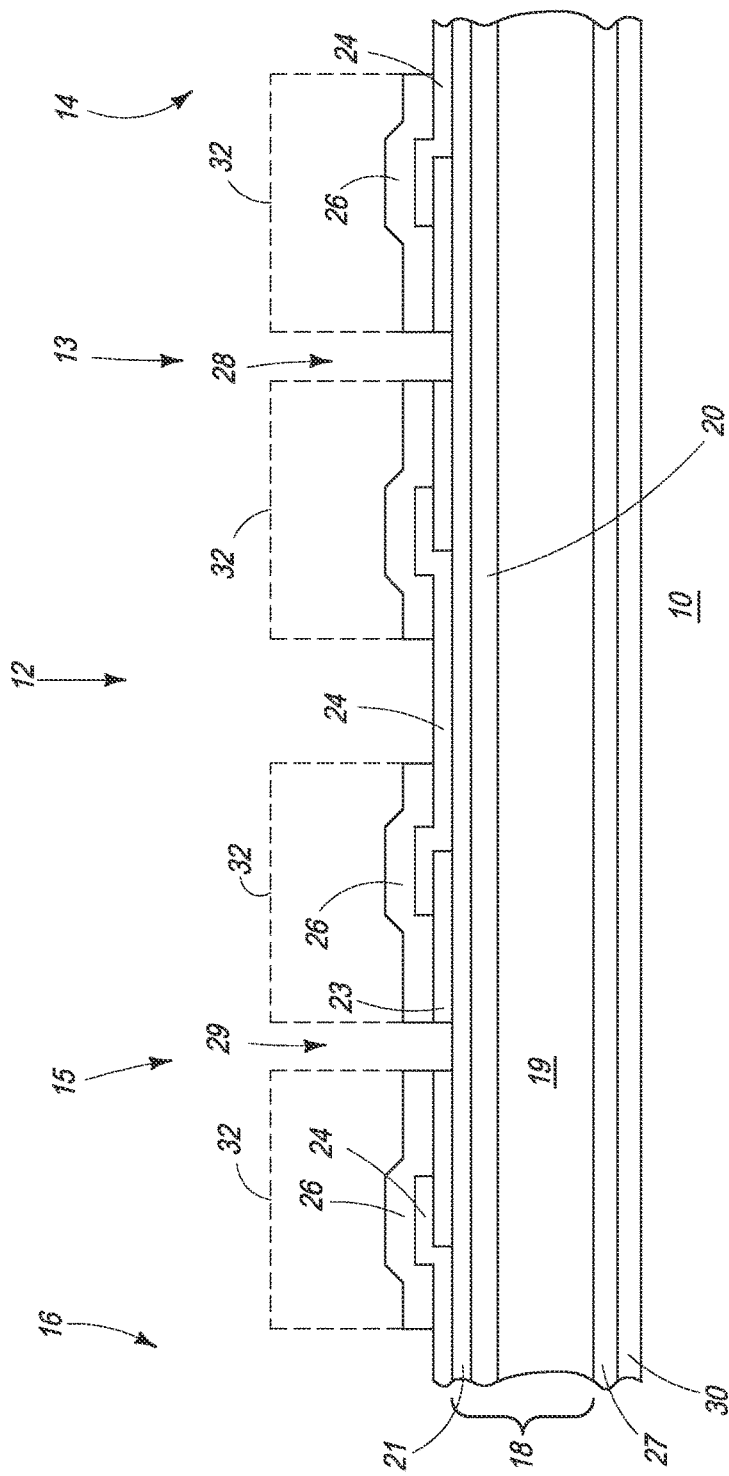
FIG. 3 illustrates a subsequent state in the process of singulating the die from the wafer of FIG. 1 in accordance with the present invention.

FIG. 3 illustrates the cross-sectional portion of wafer 10 in FIG. 2 at a subsequent stage in an example of an embodiment of the process of singulating dice 12, 14, and 16 from wafer 10. After the passivation layer of dielectric 26 is formed, a mask 32, illustrated by dashed lines, may be applied to the surface of substrate 18 and patterned to form openings that expose portions of dielectric 26 overlying each pad 24 and also overlying portions of wafer 10 where the singulation lines, such as singulation lines 13 and 15, are to be formed. Thereafter, dielectric 26 is etched through the openings in mask 32 to expose the underlying surface of pads 24 and of substrate 18. The openings that are formed through dielectric 26 in the region where the singulation lines, such as lines 13 and 15, are to be formed function as singulation openings 28 and 29. The openings that are formed through dielectric 26 overlying pads 24 function as contact openings. The etching process preferably is performed with a process that selectively etches dielectrics faster than it etches metals. The etching process generally etches dielectrics at least ten (10) times faster that it etches metals. The material used for substrate 18 preferably is silicon and the material used for dielectric 26 preferably is silicon dioxide or silicon nitride. The material of dielectric 26 may also be other dielectric materials that can be etched without etching the material of pads 24, such as polyimide. The metal of pads 24 functions as an etch stop that prevents the etching from removing the exposed portions of pads 24. In the preferred embodiment, a fluorine based anisotropic reactive ion etch process is used.

After forming the openings through dielectric 26, mask 32 is removed and substrate 18 is thinned to remove material from the bottom surface of substrate 18 and reduce the thickness of substrate 18. Generally, substrate 18 is thinned to a thickness that is no greater than about one hundred to two hundred (100 to 200) microns. Such thinning procedures are well known to those skilled in the art. After wafer 10 is thinned, the backside of wafer 10 may be metalized with a metal layer 27. This metalization step may be omitted in some embodiments. After metalization, wafer 10 usually is attached to a transport tape or carrier tape 30 that facilitates supporting the plurality of die after the plurality of die are singulated. Such carrier tapes are well known to those skilled in the art.

Figure 4:
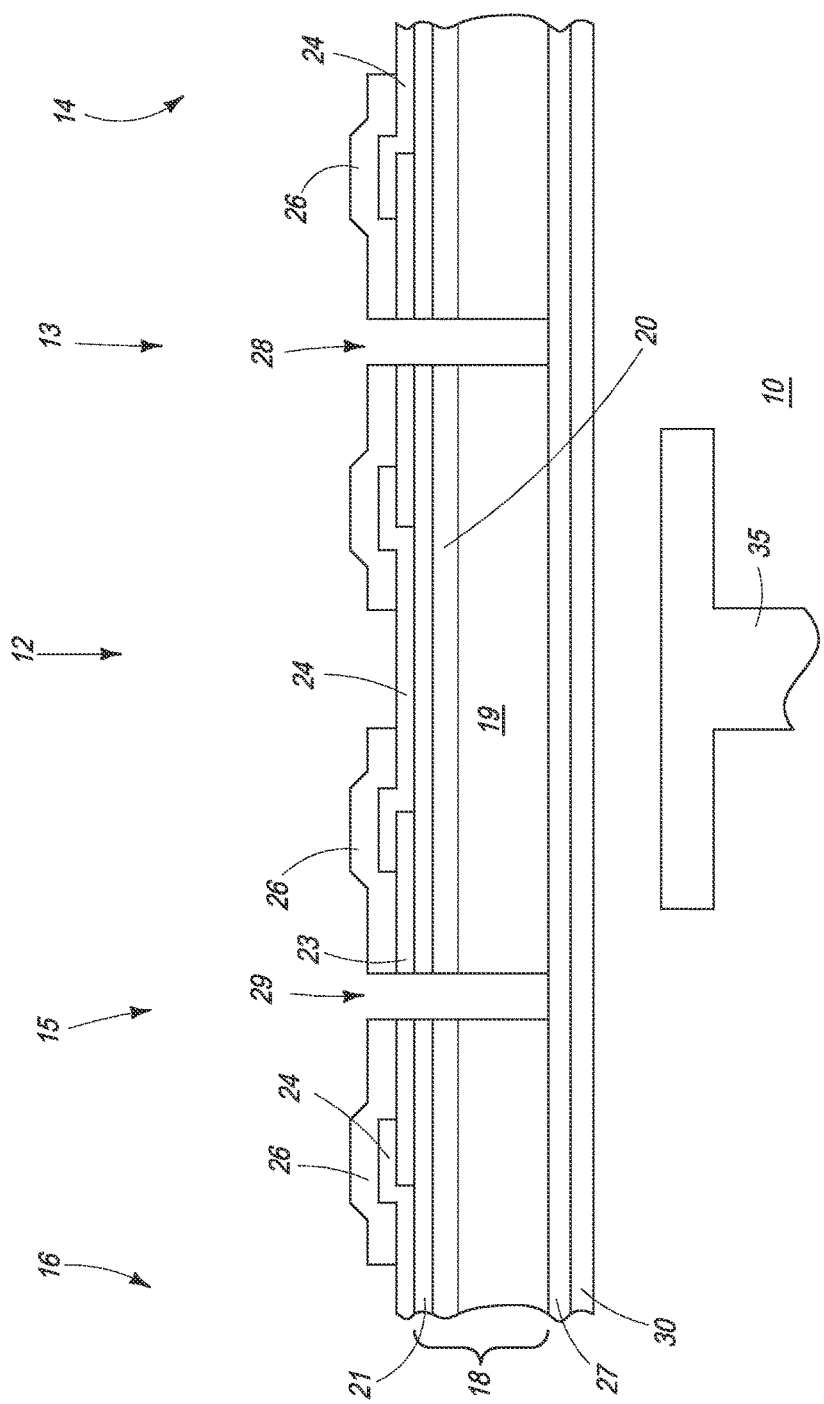
FIG. 4 illustrates another subsequent stage in the process of singulating the die from the wafer of FIG. 1 in accordance with the present invention.

FIG. 4 illustrates wafer 10 at a subsequent stage in the example process of singulating semiconductor die 12, 14, and 16 from wafer 10. Substrate 18 is etched through singulation openings 28 and 29 that were formed in dielectric 26. The etching process extends singulation opening 28 and 29 from the top surface of substrate 18 completely through substrate 18. The etching process usually is performed using a chemistry that selectively etches silicon at a much higher rate than dielectrics or metals. The etching process generally etches silicon at least fifty (50) and preferably one hundred (100) times faster than it etches dielectrics or metals. Typically, a deep reactive ion etcher system which uses a combination of isotropic and anisotropic etching conditions is used to etch openings 28 and 29 from the top surface of substrate 18 completely through the bottom surface of substrate 18. In the preferred embodiment, a process commonly referred to as the Bosch process is used to anisotropically etch singulation openings 28 and 29 through substrate 18. In one example, wafer 10 is etched with the Bosch process in an Alcatel deep reactive ion etch system.

The width of singulation openings 28 and 29 is generally five to ten (5-10) microns. Such a width is sufficient to ensure that openings 28 and 29 can be formed completely through substrate 18 and are narrow enough to form the openings in a short time interval. Typically, openings 28 and 29 can be formed through substrate 18 within a time interval of approximately fifteen to thirty (15 to 30) minutes. Since all of the singulation lines of wafer 10 are formed simultaneously, all of the singulation lines can be formed across wafer 10 within the same time interval of approximately fifteen to thirty (15 to 30) minutes. Thereafter, wafer 10 is supported by carrier tape 30 as wafer 10 is taken to a pick-and-place equipment 35 that is utilized to remove each individual die from wafer 10. Typically, equipment 35 has a pedestal or other tool that pushes each singulated die, such as die 12, upward to release it from carrier tape 30 and up to a vacuum pickup (not shown) that removes the singulated die. During the pick-and-place process, the portion of thin back metal layer 27 that underlies openings 28 and 29 breaks away and is left behind on tape 30.

Figure 5:
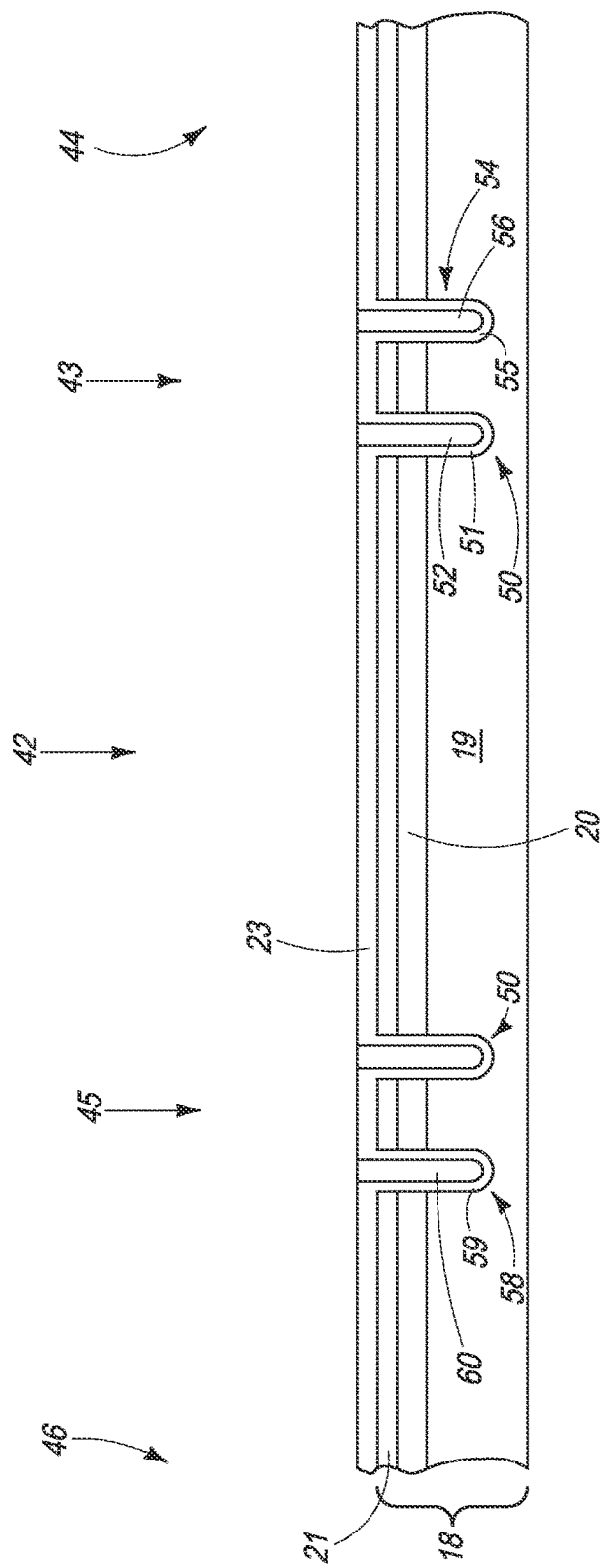
FIG. 5 illustrates an enlarged cross-sectional portion of semiconductor dice that are formed on the wafer of FIGS. 1-4 and that are alternate embodiments of the dice that are explained in the description of FIGS. 1-4.

FIG. 5 illustrates an enlarged cross-sectional portion of semiconductor dice 42, 44, and 46 that are formed on wafer 10 and that are alternate embodiments of dice 12, 14, and 16 that are explained in the description of FIGS. 1-4. Dice 42, 44, and 46 are illustrated at a manufacturing state after forming dielectric 23 on the top surface of substrate 18 and prior to forming pads 24 (FIG. 1). Dice 42, 44, and 46 are similar to dice 12, 14, and 16 except that dice 42, 44, and 46 each have a respective isolation trench 50, 54, and 58 that surround the die and isolate them from an adjacent die. Trenches 50, 54, and 58 generally are formed near an outside edge of each die. Trenches 50, 54, and 58 are formed to extend from the top surface of substrate 18 a first distance into bulk substrate 19. Each trench 50, 54, and 58 generally is formed as an opening into substrate 19 that has a dielectric formed on the sidewall of the opening and generally is filled with a dielectric or other material such as silicon or polysilicon. For example, trench 50 may include a silicon dioxide dielectric 51 on the sidewalls of the trench opening and may be filled with polysilicon 52. Similarly, trenches 54 and 58 include respective silicon dioxide dielectrics 55 and 59 on the sidewalls of the trench opening and may be filled with polysilicon 56 and 60. Singulation line 43 is to be formed between trenches 50 and 54, and singulation line 45 is to be formed between trenches 50 and 58. Trenches 50 and 54 are formed adjacent to singulation line 43, and trenches 50 and 58 are formed adjacent to singulation line 45. Methods of forming trenches 50, 54, and 58 are well known to those skilled in the art. It should be noted that trenches 50 and 54 are used as illustration only and could be any number of shapes, sizes, or combinations of isolation tubs or trenches.

Figure 6:
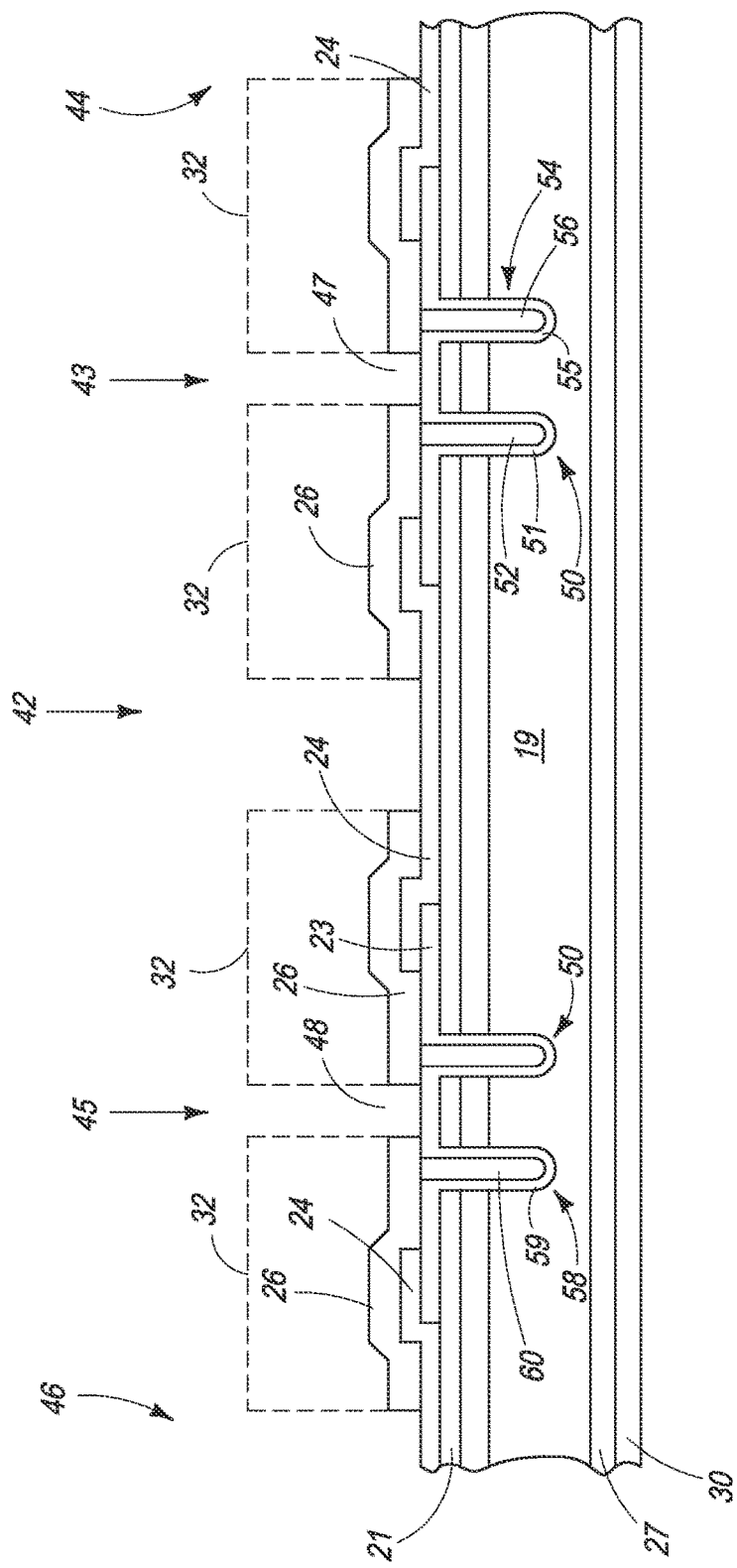
FIG. 6 illustrates a subsequent stage in the process of singulating the die of FIG. 6 in accordance with the present invention.

FIG. 6 illustrates wafer 10 at a subsequent stage in the alternate process of singulating semiconductor dice 42, 44, and 46 from wafer 10. After trenches 50, 54, and 58 are formed, other portions of dice 42, 44, and 46 are formed including forming contact pads 24 and forming dielectric 26 covering dice 42, 44, and 46. Dielectric 26 generally also covers other portions of wafer 10 including the portion of substrate 18 where singulation lines 43 and 45 are to be formed. Thereafter, mask 32 is applied and patterned to expose underlying dielectric 26 where singulation lines and contact openings are to be formed. Dielectric 26 is etched through the openings in mask 32 to expose the underlying surface of pads 24 and of substrate 18. The openings that are formed through dielectric 26 in the region where the singulation lines, such as lines 43 and 45, are to be formed function as singulation openings 47 and 48. The etching process used to form openings 47 and 48 through dielectrics 23 and 26 is substantially the same as the process used to form openings 28 and 29 (FIG. 3) in dielectric 23 and 26. Openings 47 and 48 preferably are formed so that dielectrics 51, 55, and 59 on the sidewalls of respective trenches 50, 54, and 58 are not underlying openings 47 and 48 so that the dielectrics will not be affected in subsequent operations to form singulation lines 43 and 45.

After forming openings 47 and 48 through dielectric 26, mask 32 is removed and substrate 18 is thinned and metalized with metal layer 27 as explained hereinbefore in the description of FIG. 3. This metalization step may be omitted in some embodiments. After metalization, wafer 10 is usually attached to carrier tape 30.

Figure 7:
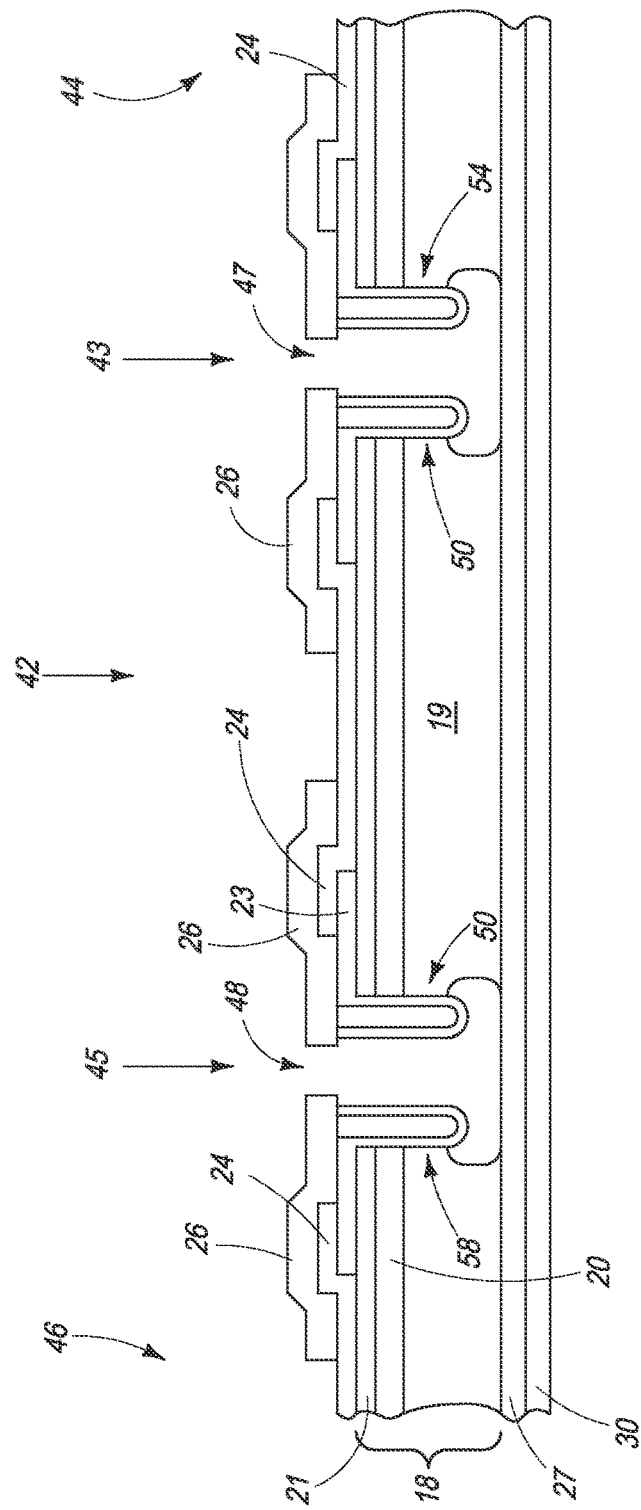
FIG. 7 illustrates another subsequent stage in the process of singulating the die of FIG. 6 in accordance with the present invention.

FIG. 7 illustrates wafer 10 at a subsequent stage in the alternate process of singulating semiconductor die 42, 44, and 46 from wafer 10. Substrate 18 is etched through singulation openings 47 and 48 that were formed in dielectric 26. The etching process extends singulation opening 47 and 48 from the top surface of substrate 18 completely through substrate 18. Openings 47 and 48 usually are at least 0.5 microns from dielectrics 51, 55, and 59. The etching process usually is an isotropic etch that selectively etches silicon at a much higher rate than dielectrics or metals, generally at least fifty (50) and preferably at least one hundred (100) times faster. Since the dielectric on the sidewalls of the trenches protects the silicon of substrate 18, an isotropic etch can be used. The isotropic etch has a much higher etching throughput than can be obtained with the use of the BOSCH process or with limited use of the Bosch process. However, the isotropic etching typically undercuts portions of substrate 19 that are underlying trenches 50, 54, and 58. Typically, a down-stream etcher with a fluorine chemistry is used to etch openings 28 and 29 from the top surface of substrate 18 completely through the bottom surface of substrate 18 and expose a portion of layer 27 underlying openings 28 and 29. In one example, wafer 10 is etched in the Alcatel deep reactive ion etch system using full isotropic etching. In other embodiments, isotropic etching may be used for most of the etching and anisotropic etching may be used for another portion of the etching (the Bosch process). For example, isotropic etching may be used until openings 28 and 29 extend to a depth that is substantially the same depth as trenches 50, 54, and 58, and anisotropic etching may be used thereafter to prevent the undercutting of trenches 50, 54, and 58.

The width of singulation openings 47 and 48 is generally about the same as the width of openings 28 and 29. Dice 42, 44, and 46 may be removed from tape 30 similarly to the manner of removing dice 12, 14, and 16.

FIG. 8 illustrates an enlarged cross-sectional portion of an example of an embodiment of wafer 10 taken along a cross-section line 8-8 that is illustrated in FIG. 1. A thickness 70 of substrate 18 and wafer 10 is illustrated by an arrow. FIG. 8 illustrates additional singulation lines 11 that are similar to singulation lines 13 and 15. A second surface 17 of substrate 18 and wafer 10 is illustrated opposite to the surface on which layer 20 is formed.

FIG. 9 illustrates wafer 10 at a stage of an embodiment of one example method of singulating die from wafer 10. In some embodiments, thickness 70 of wafer 10 may be reduced. Typically, wafer 10 is inverted in order to facilitate reducing thickness 70. In some embodiments, a support structure 34 may be attached to wafer 10 along the top surface in order to facilitate thinning wafer 10. In other embodiments, support structure 34 may be omitted. Thickness 70 may be reduced by methods such as back-grinding, chemical etching, chemical-mechanical polishing (CMP), or other means.

A conductor 37 is applied to surface 17. Typically, conductor 37 is a metal such as metal 27. However, conductor 37 may be a thicker metal than metal 27, or may be other materials such as conductive epoxy, or thermal heat sink material, or other materials that do not include the material of substrate 19.

Figure 10:
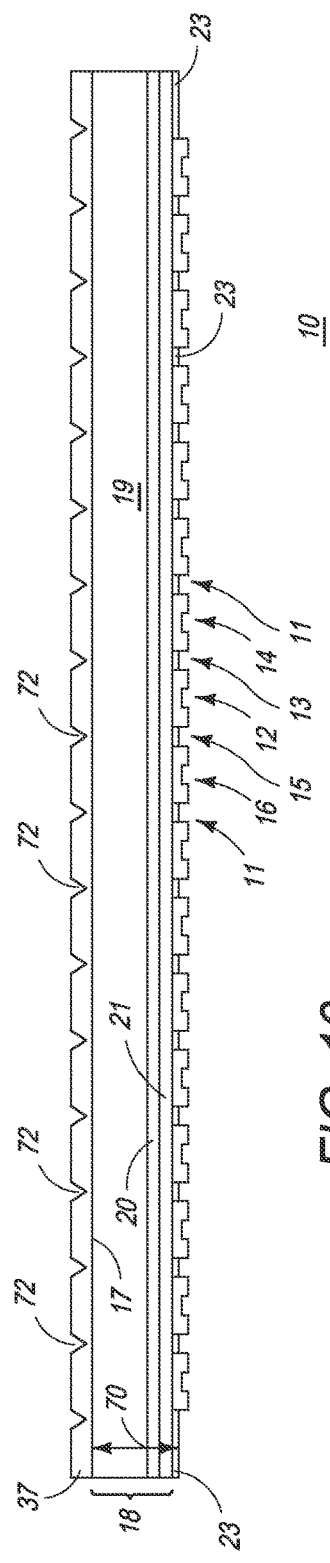

FIG. 10 illustrates wafer 10 at another subsequent stage of the example method. Portions of conductor 37 that underlie regions of wafer 10 where singulation lines are to be formed may have the thickness reduced thereby forming reduced thickness regions 72 of conductor 37. Regions 72 usually are formed to underlie portions of wafer 10 where singulation lines are to be formed such as lines 11, 13, and 15. Regions 72 may also be disposed at other portions of the plurality of semiconductor dies. Support structure 34 may or may not be utilized during this operation.

Figure 11:
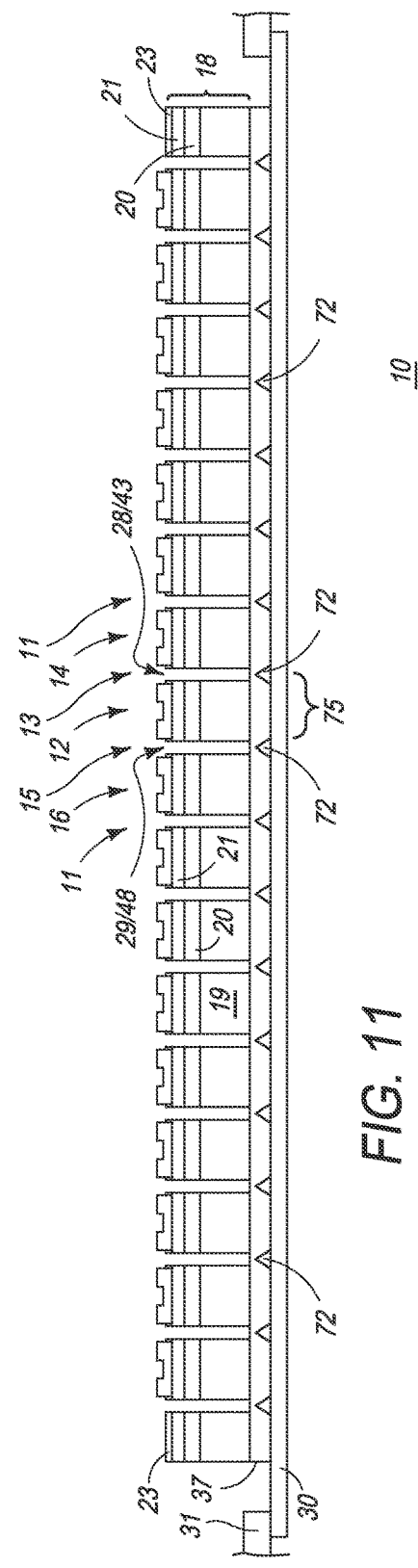

FIG. 11 illustrates wafer 10 at another subsequent stage of the example method. Wafer 10 is mounted on tape 30. Tape 30 usually is applied to wafer 10 in order to support wafer 10 during subsequent die singulation operations. Conductor 37 overlies tape 30. Conductor 37 typically is disposed on tape 30, however, in some embodiments there may be an intervening material between tape 30 and conductor 37. A support frame 31 may be attached to tape 30 to facilitate handling tape 30 and wafer 10.

Singulation openings, such as singulation openings 28, 29 or 43, 48, are formed in wafer 10 along the singulation lines, such as singulation lines 11, 13, 15, by methods such as those explained hereinbefore in the description of FIGS. 1-7. The singulation openings may also be formed by methods such as those explained in related U.S. patent application Ser. No. 12/689,098 of inventor Gordon Grivna having a common assignee herewith and a title of SEMICONDUCTOR DIE SINGULATION METHOD which was filed on Jan. 18, 2010 and is incorporated herein by reference. Typically, the width of the singulation openings is greater than the width of the widest portion of region 72.

Subsequently, an individual die, such as die 12, may be singulated from the remainder of wafer 10. For example, a pick-and-place operation may be utilized to remove die 12 such as illustrated and explained in the description of FIG. 4.

During the singulation operation, regions 72 facilitate separating the portion of conductor 37 that underlie a semiconductor die, such as portion 75 underlying die 12, from the remainder of conductor 37. Because the thickness of conductor 37 has been reduced in regions 72, conductor 37 easily separates along regions 72 thereby leaving portion 75 attached to die 12. In embodiments where regions 72 do not align with the singulation openings, such as regions 72 being formed to both sides of the singulation openings, regions 72 still facilitate separating the portion of conductor 37 that underlie a semiconductor die, such as portion 75 underlying die 12, from the remainder of conductor 37. Because conductor 37 has regions 72, in some embodiments conductor 37 may have a thickness that is greater than metal 27.

In the preferred embodiment, regions 72 extend to approximately ninety percent (90%) of the way through conductor 37 in order to facilitate separation along regions 72. In other embodiments, regions 72 may extend completely through conductor 37. In some embodiments, surface 17 of wafer 10 may be exposed by regions 72. In still other embodiments, forming conductor 37 may cause the formation of a metal-silicon alloy along the interface between conductor 37 and substrate 18 or between conductor 37 and substrate 18. For such an embodiment, regions 72 typically would not extend through the metal-silicon alloy.

Figure 12:
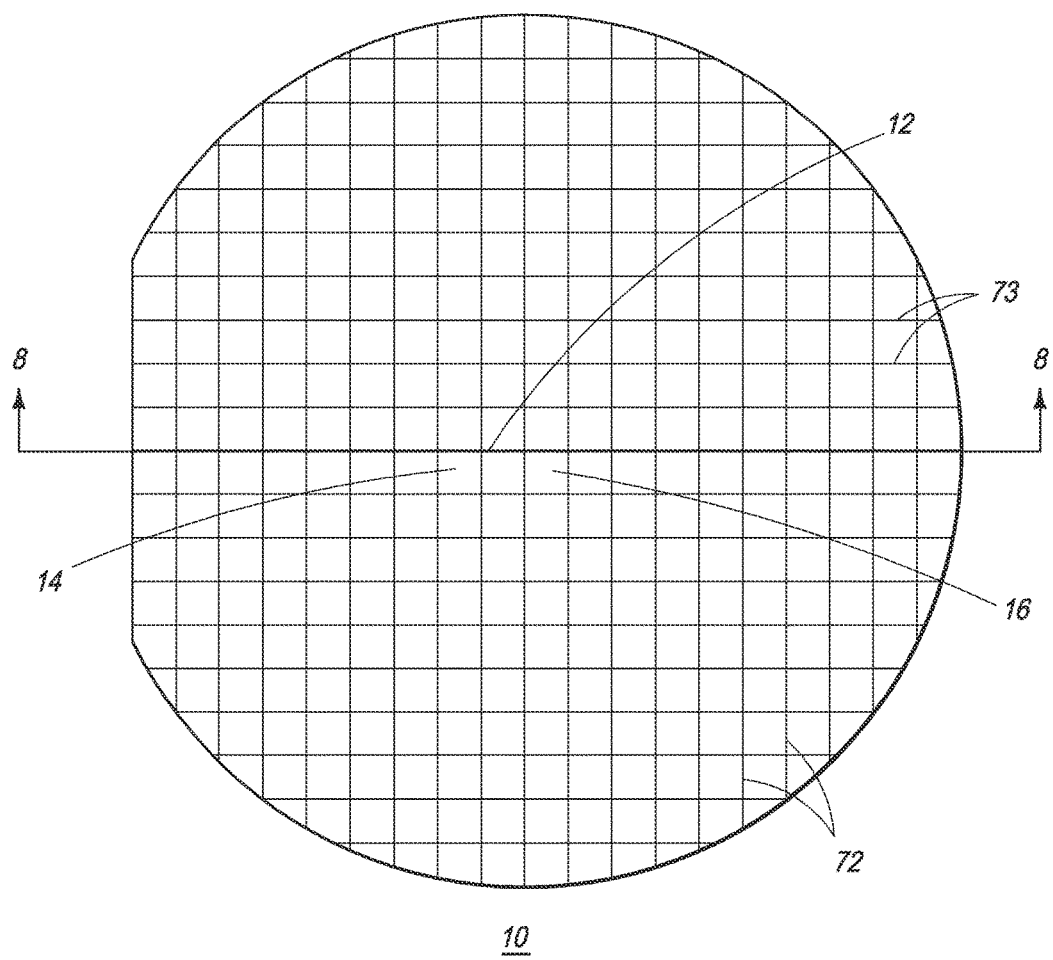
FIG. 12 illustrates an enlarged plan view of the backside of wafer 10 in accordance with the present invention.

FIG. 12 illustrates an enlarged plan view of the backside of wafer 10 after forming conductor 37 and regions 72. Typically, regions 72 are formed to underlie all the singulation lines. Thus, regions 72 may traverse wafer 10 and one direction and other regions 73 that are similar regions 72 may traverse wafer 10 in other directions in order to underlie all the singulation lines of wafer 10.

Figure 13:
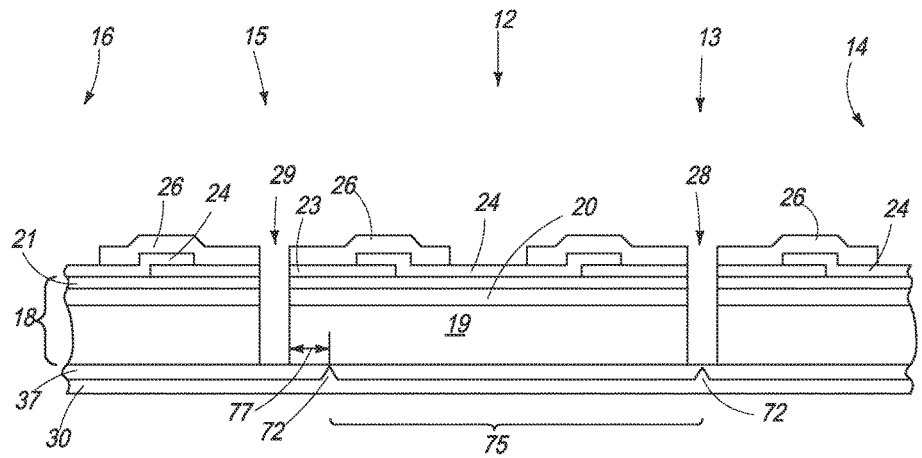
FIG. 13 illustrates an enlarged cross-sectional view of a portion of the semiconductor wafer of FIG. 11 in accordance with the present invention.

FIG. 13 illustrates an enlarged plan view of a portion of wafer 10 near die 12, 14, and 16. Preferably, regions 72 underlie the singulation openings such as openings 28 and 29. In some embodiments, all or a portion of regions 72 may be offset from an edge of the singulation openings by an offset distance 77, identified in general by an arrow. For example, the backside alignment may result is such offset or it may be desirable to reduce the area of portion 75. It is believed that in some embodiments distance 77 may be five percent (5%) of the width of the die and still provide the desired uniform singulation of the semiconductor die including portion 75.

Figure 14:
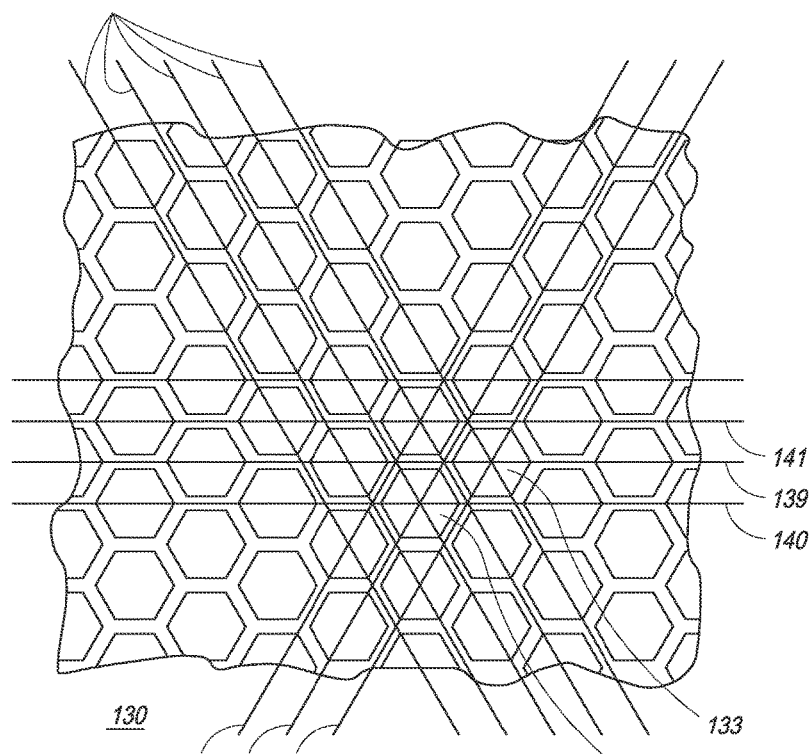
FIG. 14 illustrates an enlarged plan view of a backside of an alternate embodiment of wafer 10 in accordance with the present invention.

FIG. 14 illustrates an enlarged plan view of a portion of an example of an embodiment of a wafer 130 having hexagonal shaped die. Wafer 130 is similar to wafer 10 except that the die have a hexagonal shape. The view of FIG. 14 shows the shape of the die such as die 132 and 133, and also illustrates a bottom view to explain where a conductor, such as conductor 37, would have to be thinned to form reduced thickness regions such as regions 72 in FIG. 13. Conductor 37 is not illustrated for clarity of the explanation. For such a die configuration, several sets of reduced thickness regions 72 typically would be used to assist in singulating the die of wafer 130. Examples of reduced thickness regions similar to regions 72 are illustrated in a general manner as reduced thickness regions 135-137, 139-141, and 142. The reduced thickness regions, such as regions 72, 135-137, 139-141, and 142, may not all be formed to only underlie the regions where the singulation lines or singulation openings are to be formed because it would be difficult to form regions 72 in the pattern of the non-parallelogram shaped die. In such die patterns, reduced thickness regions, such as regions 72, 135-137, 139-141, and 142, may also be formed to cross the wafer in regions near where the singulation lines and singulation openings are not to be formed. For example, regions 135-137 may be formed near one side of a series of die such as region 137 formed near one side of die 132 to be near a singulation opening for die 132. Region 137 may also traverse wafer 130 near one side of other die that are aligned with die 132. Region 137 may also cross under the interior of other die, such as die 133, that are not aligned with die 132. Region 136 may be offset to traverse near one side of die 133 to be near a singulation opening for die 133 and this may cause region 136 to also traverse under the interior of die 132, for example under active regions of die 132. Another group of reduced thickness regions, such as regions 139-141, may traverse wafer 130 along another side of the die, for example regions 140 and 141 may traverse near two opposite sides of die 132 to be near other singulation openings for die 132. This may cause region 141 to also traverse under the interior of die 133 because of the off-set relationship of the die. Regions 142 may be formed to traverse across wafer 130 in another direction along another side of the die in order to be near other singulation opening for the die. Thus in general, reduced thickness regions may be formed to traverse in groups in one direction and in other groups in another direction wherein portion of regions of one group may be near an edge of a die such as underlying near singulation openings, while other regions of the group traverse to underlie interior portions of other die.

One skilled in the art will appreciate that such groups may also be formed for a wafer that has die of different sizes, for example different sized parallelogram shaped die. The reduced thickness regions may be formed in one group that are positioned near an edge of die of one size to be near singulation openings for that die and may underlie interior portions of other die which have a different size.

One skilled in the art will appreciate that such a method allows putting the hexagonal shaped die closer together and still being able to uniformly singulate the die thereby increasing the number of die that can be formed in a given area of a wafer. Such a method also allows putting die of different sizes closer together and increasing the number of die that can be formed in a given area of a wafer.

Figure 15:
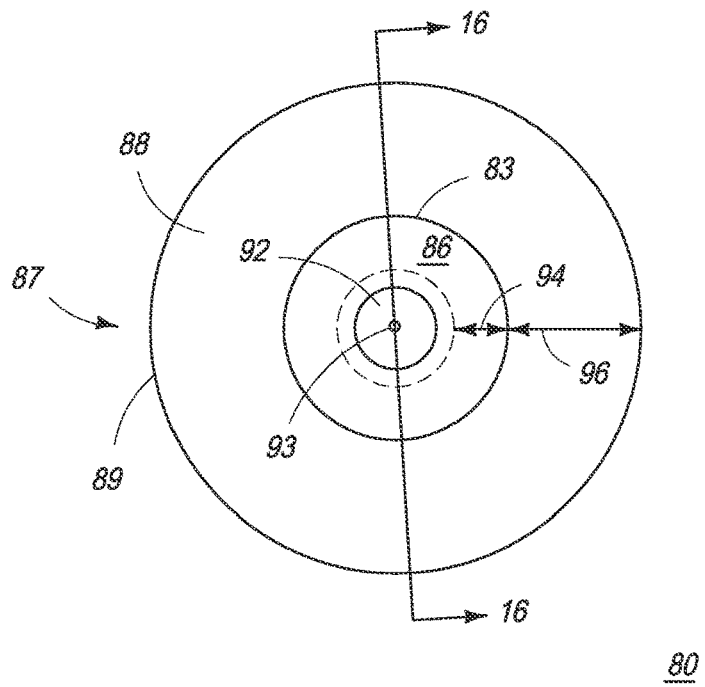
FIG. 15 illustrates a side view of a portion of an example of an embodiment of a tool for use in reducing a thickness of a material in accordance with the present invention.

FIG. 15 illustrates a side view of a portion of an example of an embodiment of a tool 80, such as a cutting tool or scribing tool, that may be used to form regions 72.

Figure 16:
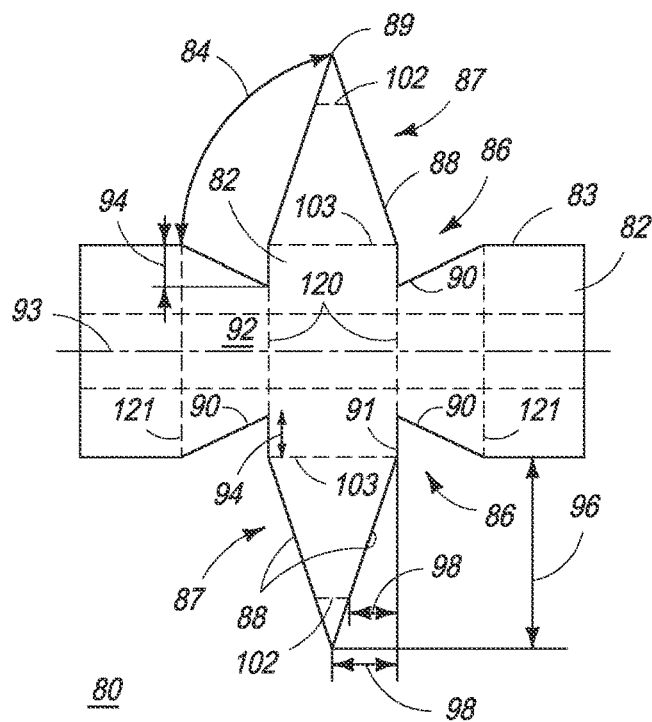
FIG. 16 illustrates a cross-sectional view the tool of FIG. 15 in accordance with the present invention.

FIG. 16 illustrates a cross-sectional view of tool 80 taken all along a cross-sectional line 14-14.

Figure 17:
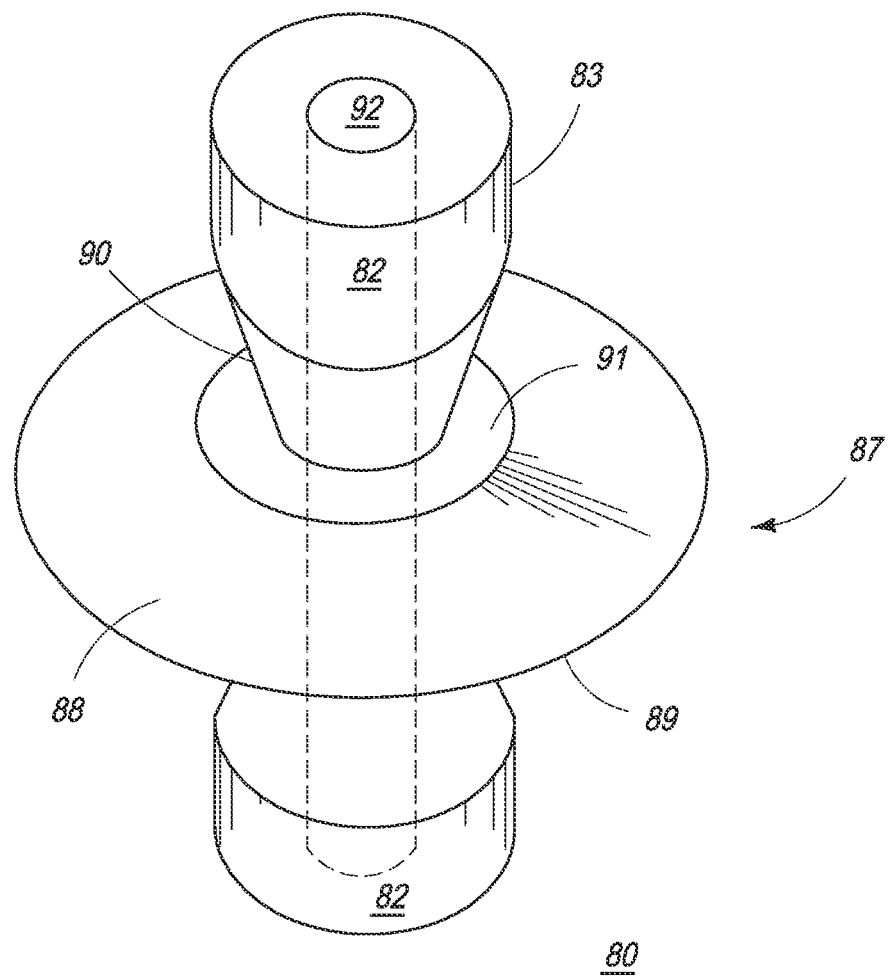
FIG. 17 illustrates an isometric view of the tool of FIG. 15 in accordance with the present invention.

FIG. 17 illustrates an isometric view of tool 80. This description has references to FIGS. 13-15. Tool 80 includes a cutting tip 89 and a cutting surface 88 that is adjacent to tip 89 and extends from tip 89 toward a central support section 82 of tool 80. Tip 89 and cutting surfaces 88 are configured to engage with a material which is to be scribed or cut, such as conductor 37 on wafer 10, and reduce the thickness of the material, such as forming regions 72 in conductor 37. Tool 80 also includes a depth stop 83 that is configured to limit the penetration of tip 89 and surfaces 88 into the material. Tip 89 is formed to extend a cutting distance 96 from stop 83. Distance 96 is the distance that tip 89 and surface 88 may extend into or penetrate the material to be cut.

Typically, tip 89 and surface 88 are configured as a cutting wheel that rolls along the material so that tip 89 and surfaces 88 penetrate into the material as tool 80 rotates along the material. For such an embodiment, surface 88 is rotatingly attached to section 82. Although tip 89 is illustrated as a sharp or pointed tip, tip 89 may have various configurations including a blunt tip as illustrated by a dashed line 102. The portion of cutting surface 88 that extends distance from depth stop 83, illustrated by a dashed line 103, to tip 89 forms a cutting volume for tool 80.

Tool 80 typically includes a central opening 92 that extends along a major axis 93. In most embodiments, a shaft is typically inserted through central opening 92 so that tool 80 may rotate around the shaft.

In the preferred embodiment, central support section 82 is a solid piece that has a width which is greater than a width 98 of surface 88. In other embodiments, section 82 may be formed from multiple elements that are abutted together to form section 82. For example, section 82 may separate into pieces as illustrated by dashed lines 120 and 121. These pieces may be abutted together to form tool 80. For example, the shaft through opening 92 may hold the pieces together. Although tool 80 is illustrated with opening 82, in other embodiments opening 92 may be omitted. In other embodiments, tool 80 may have an attachment device, such as a peg or screw, extending from section 82 along axis 93 and the attachment device may be used to section 82 and other portions of tool 80.

During the process of using tool 80 for scribing or cutting the material, the cutting volume of tool 80 usually causes portions of the material to be displaced or forced out from within the material up toward the surface of the material. In order to control the portions of the material that are displaced and to assist in more accurate control of the cutting depth, tool 80 includes an accumulation region 86 (indicated in general by an arrow). Accumulation region 86 provides a space for displaced material to accumulate as tool 80 is cutting or scribing the material. Accumulation region 86 minimizes the forced out material from coming between depth stop 83 and the surface of the material being cut or scribed. Consequently, as the displaced material is forced out it is accumulated by region 86 so that tip 89 may extend distance 96 into the material. As will be explained further hereinafter, the displaced material accumulated within region 86 usually is extruded toward the surface of the material as tool 80 moves across the material.

Typically, accumulation region 86 is formed as a recess in section 82 and adjacent to surface 88. Region 86 has sides 90 and 91 that extend into section 82 away from surface 88 and away from stop 83. Preferably, recess 86 is formed to have a volume that is approximately the same as the cutting volume so that the forced out material may substantially fit within accumulation region 86. In some embodiments, the volume of the accumulation region may be less than the cutting volume, but such a configuration may cause excess material in regions 72. In other embodiments the volume of region 86 may be greater than the cutting volume. In one embodiment, the volume of the accumulation region is no less than the cutting volume. In the preferred embodiment, surface 88 extends at an angle 84 of approximately one hundred ten degrees (110) from a line parallel to the surface to be cut. For example, angle 84 may be from surface 88 to the surface of stop 83. Angle 84 typically can vary from about ninety five to about one hundred thirty five (95-135) degrees and still provide the desired accurate depth control and can also provide uniform separation of the material. For example, to provide uniform separation during the singulation of semiconductor die. Those skilled in the art will appreciate that the relationship between the cutting and accumulation volumes should be maintained as angle 84 changes.

Although accumulation region 86 is illustrated as a triangle, sides 90 and 91 may have various shapes that facilitate accumulating the extruded material. For example, tip 89 can have a width from 0.2 to 0.55 microns for respective distance 96 of one to three (1-3) microns.

Figure 18:
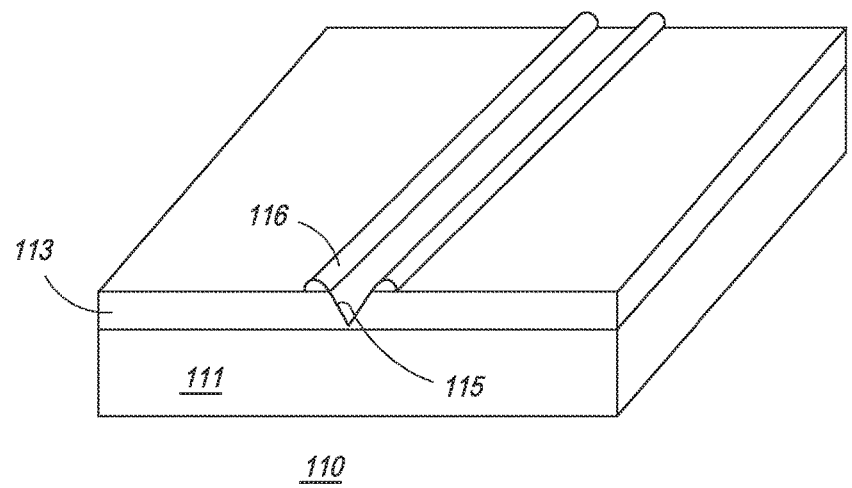
FIG. 18 illustrates an enlarged isometric view of a portion of a semiconductor wafer according to an example embodiment of a method of using the tool of FIG. 14-FIG. 16 in accordance with the present invention.

FIG. 18 illustrates an enlarged isometric view of a portion of a semiconductor wafer 110 that is similar to wafer 10. Wafer 110 includes a substrate 111 that is similar to substrate 18. A conductor 113 is formed on a surface of wafer 110 similar to conductor 37. In an operation, tool 80 was engaged with conductor 113 and moved across the surface of conductor 113 to reduce the thickness of conductor 113. Tip 89 and surfaces 88 penetrated into conductor 113 and stop 83 abutted the surface of conductor 113. As tool 80 moved across conductor 113, a reduced thickness region 115 was formed. In one embodiment, region 115 could be considered as a trough formed in conductor 113. The penetration of tool 80 displaced portions of conductor 113 out of conductor 113. These displaced or forced out portions were controlled within region 86 of tool 80 and formed onto the surface of conductor 113 as ridges 116 on the surface of conductor 113 adjacent to the region 115.

Without accumulation region 86, the displaced material may have been left behind within region 115 thereby causing an irregular depth within region 115, or may have stuck to the surface of the tool used to form region 115 thereby also forming an irregular depth. The irregular depth could result in non-uniform separation of the material during die singulation. The irregular depth also could result in irregular debris or contamination thereby resulting in unusable semiconductor die.

Those skilled in the art will appreciate that although the method of singulating die from wafer 10 is explained to form the reduced thickness regions prior to forming the singulation openings, the sequence could be changed. For example, wafer 10 could be applied to tape 30 and the singulation openings formed, then the reduced thickness regions could be formed in conductor 37. For example, the reduced thickness regions may be formed from either side of the singulation openings. Additionally, regions 72 may be formed by means other than with tool 80. For example, regions 72 may be formed by photoresist masking and etching, a wafer scribe tool, a saw blade, or laser ablation. In some embodiments, tool 80 may be used to make multiple passes across a material, material 113 for example, in order to form regions 72 to the desired depth. For example tool 80 may make one pass to form regions 72 to a first depth and another pass to form regions 72 to a greater depth.

Figure 20:
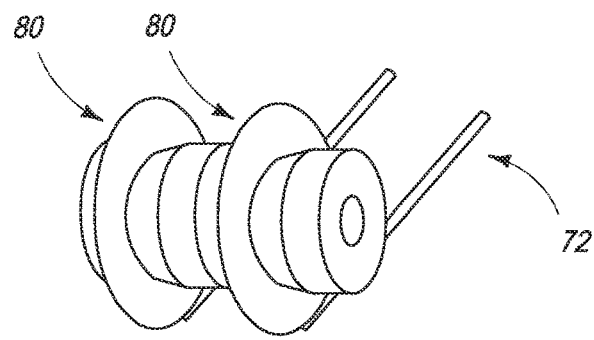
FIG. 20 illustrates in a very general manner an isometric view of a cutting tool formed to have multiple cutting tips in accordance with the present invention.

In some embodiments, a cutting tool may be formed to have multiple cutting tips 88 to enable simultaneous cutting of multiple regions 72 as illustrated by a multiple cutting tool 145 in FIG. 20. Two tools 80 may be configured to simultaneously thin two regions 72 during one pass. The two tools 80 may be arranged substantially parallel along axis 93. In other embodiments, the tools may be parallel but not aligned along axis 93. In other embodiments, the tool 80 may be formed to have different distances 96 and/or angles 102.

Figure 19:
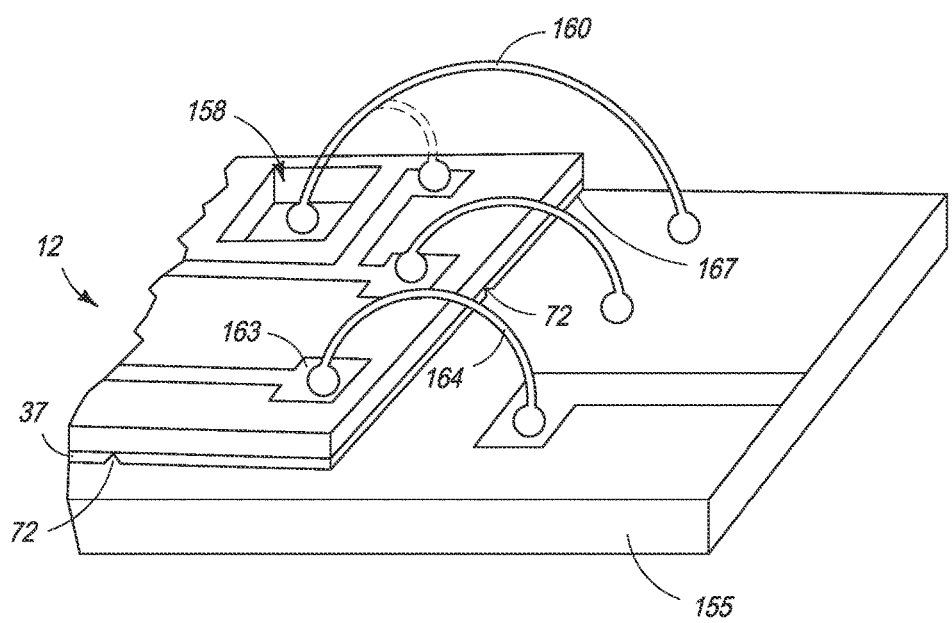
FIG. 19 illustrates an enlarged isometric view of a die of the wafer of FIG. 1 after singulation from the wafer in accordance with the present invention.

FIG. 19 illustrates an enlarged isometric view of die 12 after singulation from wafer 10 and after attachment to a mounting platform 155. Platform 155 may be a portion of a semiconductor package, such as a flag region, or may be a portion of another type of platform suitable for mounting die 12. Connections usually are made to electrically connect portions of die 12 to elements external to die 12. For example, a connection 164 may be formed between a connection pad 163 of die 12 and electrical traces on platform 155.

In some cases, it may be desirable to electrically connect conductor 37 or a portion of conductor 37 to electrical connection points on platform 155 or to electrical connection points on die 12 (illustrated in general by dashed lines). During the steps of forming singulation openings for singulating die 12, the methods used for forming the singulation openings may be used to form an opening in an interior of die 12 such as an opening 158. Opening 158 may be formed to expose a portion of conductor 37. Subsequently, a connection 160 may be attached to the portion of conductor 37 that is exposed in opening 158.

In some cases, it may also be desirable to isolate the portion of conductor 37 that is connected to connection 160 from other portions of conductor 37. Regions 72 may be used to separate conductor 37 into portions or sections. Regions 72 may be formed underlying interior portions of die 12 to separate one portion of conductor 37, such as a portion 167 to which connection 160 is electrically attached, from other portions of conductor 37.

Connection 160 is illustrated as a bonding wire connection; however, those skilled in the art will understand that other types of connection mechanisms may be used to form the connections and provide an electrical connection between the elements.

Figure 21:
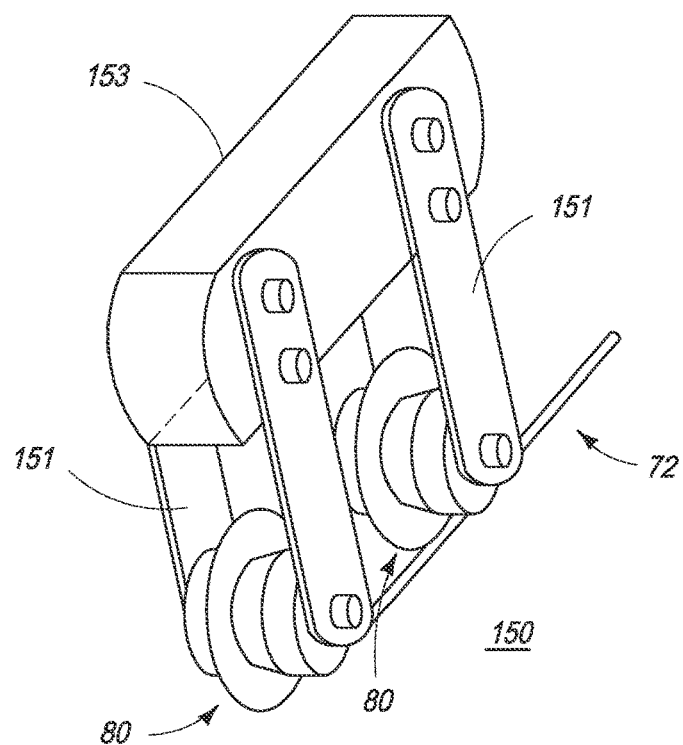
FIG. 21 illustrates in a very general manner an isometric view of a ganged tool for use in reducing a thickness of a material in accordance with the present invention.

FIG. 21 schematically illustrates in a very general manner an isometric view of a ganged tool 150 that may be used to reduce the thickness of a region of a material, for example a material on a surface of a semiconductor wafer. Tool 150 is similar to tool 80 but includes a support section that is suitable for accommodating a plurality of tools 80. Tool 150 may be used to make multiple passes along a region, such as a region 72, to reduce the thickness of the region. In some embodiments, one of the tool 80 elements may be set to have a first depth into the material to be reduced and another of the tool 80 elements may have a second depth that is greater than the first depth. Those skilled in the art will appreciate that one of those two depths may or may not be limited by surface 83. In other embodiments, two or more of tool 80 elements may have the same depth, or another one or more of the tool 80 elements may have a different depth. In some embodiments, tools 80 of tool 150 may have different angles 102 from each other and/or may have different shapes of surface 88 and/or tip 89 to facilitate cut profile and depth control. Tool 150 facilitates making multiple cuts into the material in one pass across the material thereby reducing cycle time and associated manufacturing costs. Tool 150 can also reduce the pressure requirements needed by a single tool 80 thereby further improving the uniformity of the cut.

Tool 150 includes vertical supports 151 that are formed to engage with and support a tool 80. A projection from support 151 could mate to opening 92 of tool 80 (see FIGS. 15-17) to support tool 80. Supports 151 extend from another support 153 that is attached to a means for moving and controlling tool 150.

Those skilled in the art will appreciate that in one embodiment, A method of singulating semiconductor die from a semiconductor wafer comprises: providing a semiconductor wafer, a wafer 10 for example, formed from a silicon semiconductor material and having a plurality of semiconductor dies formed on a first surface of the semiconductor wafer, the plurality of semiconductor dies separated from each other by singulation regions where singulation openings, such as openings 28 and 29, are to be formed wherein the plurality of semiconductor dies include a dielectric layer overlying portions of the plurality of semiconductor dies, the semiconductor wafer including a second surface that is opposite to the first surface; forming a conductor, conductor 37 for example, on the second surface of the semiconductor wafer, the conductor having a thickness; reducing the thickness of portions of the conductor to form a reduced thickness region, such as a region 72, of the conductor; attaching the semiconductor wafer to a carrier tape, a carrier tape 30 for example, wherein the conductor overlies the carrier tape; and etching a first opening, opening 28 for example, to extend into the semiconductor wafer thereby creating a space between the plurality of semiconductor dies wherein the carrier tape remains attached during the etching.

In another embodiment, the method may also include separating one semiconductor die of the plurality of semiconductor dies from the carrier tape and from other die of the plurality of semiconductor dies wherein a first portion of the conductor remains attached to the one semiconductor die and is separated from other portions of the conductor along the reduced thickness region.

In other embodiments, the method may further include etching the first opening from the first surface of the semiconductor wafer through the semiconductor wafer to the second surface.

Another embodiment may include that the step of reducing the thickness of the portions of the conductor to form the reduced thickness regions includes forming the reduced thickness regions in the portions of the conductor that underlie the singulation regions.

Still other embodiments may include, wherein etching the first opening includes using etching the first opening to expose a surface of the semiconductor wafer; and etching through the first opening to extend a depth of the first opening into the semiconductor wafer thereby creating the space between the plurality of semiconductor dies wherein the carrier tape remains attached during the etching.

Those skilled in the art will appreciate that in one embodiment, a cutting tool, for example tool 80, comprises: a central support section, section 82 for example, having a major axis, such as an axis 93; a cutting tip, for example tip 89; a cutting surface, surface 88 for example, adjacent to the cutting tip and extending from the cutting tip toward the central support section terminating in a distal end, distal end 103 for example, of the cutting surface wherein the cutting surface is attached to the central support section; a depth stop, stop 83 for example, spaced a first distance from the cutting tip toward the central support section wherein a first volume, such as a cutting volume, is formed by a portion of the cutting surface extending from the cutting tip to the depth stop; and an accumulation region, region 86 for example, adjacent to the central support section and extending away from the cutting surface, the accumulation region having a second volume, such as a volume 86, that approximates the first volume.

Another embodiment may include that the accumulation region extends from the distal end of the cutting surface away from the cutting tip.

Other embodiments mat include that the depth stop has a first portion that is configured to engage with a surface of a conductor on a semiconductor wafer to limit a depth of penetration of the cutting tip into the conductor.

In another embodiment, the accumulation region is a formed as a recess, such formed by sides 90 and 91, disposed within the central support section, the accumulation region positioned adjacent to the distal end of the cutting surface and extending from the distal end of the cutting surface into the central support section.

In still another embodiment, the central support section may be rotatingly coupled to the cutting surface, for example the central support section may be formed to rotate about an axis to cause the cutting surface to also rotate.

Those skilled in the art will also appreciate that a method of forming a tool, tool 80 for example, for a semiconductor wafer comprises: forming the tool to reduce a thickness of a material, material represented by conductor 37 for example, formed on a semiconductor wafer, such as wafer 10; forming the tool with a cutting tip, such as tip 89, and cutting surfaces, such as surface 88, that are configured to penetrate into the material to form reduced thickness regions, region 72 for example, in the material; and forming an accumulation region, region 86 for example, of the tool with a recess having a first volume for accepting portions of the material displaced from within the material by the penetration.

Those skilled in the art will also understand that in one embodiment, a method of singulating semiconductor die from a semiconductor wafer comprise: providing the semiconductor wafer, such as wafer 10, formed from a silicon semiconductor material and having a plurality of semiconductor dies, such as die 12 and 14, formed on a first surface of the semiconductor wafer and separated from each other by singulation regions of the semiconductor wafer where singulation openings, openings 28 and 29 for example, are to be formed, the semiconductor wafer including a second surface that is opposite to the first surface; providing a conductor on the second surface of the semiconductor wafer, the conductor having a thickness; engaging a cutting tool with the conductor to reduce the thickness of portions of the conductor, the cutting tool having a cutting tip and cutting surfaces that penetrate into the conductor to form reduced thickness regions in the conductor; and moving the cutting tool across the conductor to form the reduced thickness regions.

In view of all of the above, it is evident that a novel device and method is disclosed. Included, among other features, is etching singulation openings completely through a semiconductor wafer. Etching the openings from one side assists in ensuring that the singulation openings are substantially aligned to the semiconductor edge and preferably are precisely aligned. Etching from one side also ensures that the singulation openings have very straight side-walls thereby providing a uniform singulation line along each side of each semiconductor die. Etching the singulation openings completely through the semiconductor wafer facilitate forming narrow singulation lines thereby allowing room to use for forming semiconductor die on a given wafer size. The etching process is faster than a sawing process, thereby increasing the throughput of a manufacturing area.

While the subject matter of the invention is described with specific preferred embodiments, it is evident that many alternatives and variations will be apparent to those skilled in the semiconductor arts. For example, layers 20 and/or 21 may be omitted from substrate 18. The singulation openings alternately may be formed prior to or subsequent to forming the contact openings overlying pads 24. Also, the singulation openings may be formed before thinning wafer 10, for example, the singulation openings may be formed partially through substrate 18 and the thinning process may be used to expose the bottom of the singulation openings.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

The invention claimed is:

1. A method of forming a tool for a semiconductor wafer comprising:
    forming the tool to reduce a thickness of a semiconductor material formed on a semiconductor wafer;
    forming the tool with a cutting tip and cutting surfaces that are configured to penetrate into the semiconductor material to form reduced thickness regions in the semiconductor material including forming some of the cutting surfaces to intersect and form a cutting volume; and
    forming an accumulation region of the tool with a recess having a first volume for accepting portions of the semiconductor material displaced from within the semiconductor material by the penetration wherein the first volume is no less than the cutting volume.

2. The method of claim 1 further including forming the cutting tip and a the cutting surface adjacent to the cutting tip and extending from the cutting tip toward a central support section and terminating in a distal end of the cutting surface wherein the cutting surface is attached to the central support section.

3. The method of claim 2 further including forming a depth stop spaced a first distance from the cutting tip toward the central support section wherein a cutting volume is formed by a portion of the cutting surface extending from the cutting tip to the depth stop and wherein the cutting volume is approximately equal to the first volume.

4. The method of claim 2 including forming the accumulation region as a recess disposed within a central support section, the accumulation region positioned adjacent to an end of a cutting surface of the cutting surfaces and extending from the distal end into the central support section.

5. The method of claim 2 further including forming the cutting tip and cutting surfaces for being rolled along a surface of the semiconductor wafer, and forming the cutting surface attached to a central support section having a surface that forms a depth stop to limit the depth that the cutting tip extends into the semiconductor wafer.

\* \* \* \* \*